(12) United States Patent
Ward

(10) Patent No.: US 8,621,411 B1
(45) Date of Patent: Dec. 31, 2013

(54) GENERATING AND SELECTING BIT-STACK CANDIDATES FROM A GRAPH USING DYNAMIC PROGRAMMING

(75) Inventor: Samuel I. Ward, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/552,919

(22) Filed: Jul. 19, 2012

(51) Int. Cl.
*G06F 17/50* (2006.01)
*G06F 9/455* (2006.01)
*G06F 11/22* (2006.01)

(52) U.S. Cl.
USPC ........... 716/125; 716/118; 716/119; 716/132; 716/136

(58) Field of Classification Search
None
See application file for complete search history.

(56) References Cited

U.S. PATENT DOCUMENTS

| | | |
|---|---|---|
| 5,548,747 A | 8/1996 | Rudolph |
| 5,930,499 A | 7/1999 | Chen et al. |
| 7,191,426 B1 * | 3/2007 | Singh et al. .................. 716/104 |
| 7,360,190 B1 * | 4/2008 | Singh et al. .................. 716/113 |
| 2002/0144227 A1 | 10/2002 | Das et al. |
| 2010/0011324 A1 | 1/2010 | Faulkner et al. |

OTHER PUBLICATIONS

Ye, Terry et al., "Data Path Placement with Regularity," Proc. int'l. Conf. on Computer-Aided Design pp. 264-270 (2000).
Young, et al., "Placement Constraints in Floorplan Design," IEEE Trans. on VLSI Systems, v. 12, n. 7, pp. 735-745 (Jul. 2004).

* cited by examiner

*Primary Examiner* — A. M. Thompson
(74) *Attorney, Agent, or Firm* — Matthew W. Baca; Jack V. Musgrove

(57) ABSTRACT

Bit stacks of an integrated circuit design are identified in a netlist by analyzing cell clusters. Candidate bit stacks are generated for each cluster using cone tracing, and wirelength costs are calculated for the candidate bit stacks based on the cells' locations from a previous (e.g., global) placement. The bit stack partition having a minimum total wirelength cost is selected for the final bit stacks. The invention can find K bit stacks in a cell cluster having N input cells and M output cells, where K, N and M are all different. The method is advantageously made timing aware by weighting connections between cells using weights based on timing information. Once the final bit stacks have been identified, the information can be included in the netlist and passed to a datapath placer for optimized placement.

21 Claims, 8 Drawing Sheets

60

CANDIDATE TABLE

Y1  I31  I24  I17  I9   I1  X1

Y1  I31  I24  I17  I9   I1  X3

Y1  I31  I24  I17  I10  I2  X1

Y1  I31  I24  I17  I10  I2  X2

. . .

62

COST TABLE 1  1  1  2  1  1  = 7

1  1  1  2  1  3  = 9

1  1  1  1  1  2  = 7

1  1  1  1  1  1  = ⑥

. . .

GENERATING AND SELECTING BIT-STACK CANDIDATES FROM A GRAPH USING DYNAMIC PROGRAMMING

BACKGROUND OF THE INVENTION

1. Field of the Invention

The present invention generally relates to the design of semiconductor chips and integrated circuits, and more particularly to a method of identifying different portions of an integrated circuit design which may be handled differently during optimized placement of the circuit components in a layout.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements combined to perform a logic function. Cell types include, for example, core cells, scan cells, input/output (I/O) cells, and memory (storage) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins, including information about the various components such as transistors, resistors and capacitors. A layout typically consists of a set of planar geometric shapes in several layers. The layout is then checked to ensure that it meets all of the design requirements, particularly timing requirements. The result is a set of design files known as an intermediate form that describes the layout. The design files are then run through a dataprep process that is used to produce patterns called masks by an optical or electron beam pattern generator. During fabrication, these masks are used to etch or deposit features in a silicon wafer in a sequence of photolithographic steps using a complex lens system that shrinks the mask image. The process of converting the specifications of an electrical circuit into such a layout is called the physical design.

Cell placement in semiconductor fabrication involves a determination of where particular cells should optimally (or near-optimally) be located on the surface of a integrated circuit device. Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction. Given a netlist N=(V, E) with nodes (vertices) V and nets (edges) E, a global placement tool obtains locations $(x_i, y_i)$ for all the movable nodes, such that the area of nodes within any rectangular region does not exceed the area of cell sites in that region. Though some work has looked at general Steiner wirelength optimization, placers typically minimize the half-perimeter wirelength (HPWL) of the design. Modern placers often approximate HPWL by a differentiable function using a quadratic objective.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid. However, physical synthesis can take days to complete, and the computational requirements are increasing as designs are ever larger and more gates need to be placed. There are also more chances for bad placements due to limited area resources.

As technology scales beyond the deep-submicron regime and operating frequencies increase, a new style is emerging in the design of integrated circuits referred to as hybrid designs, which contain a mixture of random logic and datapath (standard cell) components. In random logic, a given logic function or cone may have cells randomly distributed in different rows to satisfy the placement constraints, with no particular boundaries for any set of cells. In contrast, datapath logic usually has more regular boundaries. Datapaths are often composed of bit slices (bit stacks) where logic for each bit typically has the same structure. For example, an 8-bit rotator will have 8 individual bit slices with the same structure. Datapath logic has traditionally been placed manually, i.e., a custom design, as seen in the example of FIG. 1A. The manually placed datapath logic (macro) 1 has a plurality of cells that have been positioned to receive select signals along the top and bottom rows as indicated by the horizontal arrows 2. Each bit slice is neatly arranged in aligned stacks as indicated by the vertical arrows 3. There has been a significant effort in recent years to include the placement of datapath logic in the automation process, particularly for hybrid designs which also contain random logic. However, placement formulation for datapath logic is generally different than that for random logic. Random logic placers ignore this aspect of hybrid designs, which can lead to major wirelength and congestion issues with state-of-the-art devices. FIG. 1B illustrates the same datapath logic as FIG. 1A but now it is an automatically placed design 4 using a random logic placer. The same select lines 2 are used for random layout 4, but the bit stacks are no longer aligned, as indicated by the zigzag arrow 5.

Methods have accordingly been devised for automatically extracting bit stacks from a netlist. Identifying the structures ahead of time allows tools to reduce the overall wirelength by making placement structure-aware. Once a bit stack is known, it can be passed to a datapath placer for improved wirelength reduction. Bit stack extraction techniques include maintaining the datapath structure from the high level description (VHDL), template based extraction, name based extraction, and network-flow based searching. In the first of these techniques, hard constraints are imposed on the design using the original datapath structure to limit the datapath optimization. In template based extraction, a template is provided as an input and used in pattern matching to generate bit-stack candidates. Name based extraction relies on the prior assignment of names or labels to cells, and tries to match names together to build the bit stacks. Network-flow based searching generates clusters based on latches or primary inputs/primary outputs. For a given cluster, input fan-out cones are searched, output fan-in cones are searched, and gates marked in both searches are provided as candidates for the bit stack. Disjoint paths between the inputs and outputs are identified such that the maximum number of gates are covered, and a flow network is constructed to capture the constraints. The min-cost solution corresponds to the maximum number of gates.

SUMMARY OF THE INVENTION

The present invention is generally directed to a method of identifying bit stacks in an integrated circuit design by receiving a circuit description for the integrated circuit design which includes a plurality of cells interconnected to form a plurality of nets wherein the cells having locations from a previous placement, identifying at least one cluster of the cells from the design, generating candidate bit stacks from groups of interconnected cells in the cluster, calculating wirelength costs for the candidate bit stacks based on the cell locations, and selecting a partition of the candidate bit stacks as final bit stacks based on the wirelength costs. In the illustrative implementation, the previous placement is derived from multiple iterations of a global placement routine, and the candidate bit stacks are generated using cone tracing from output cells of the cluster to input cells of the cluster. The cluster may or may not have been identified as a datapath structure. The final bit stacks are selected using dynamic programming whereby a group of cells which have been identified as a possible bit stack for a candidate partition are used to exclude other possible bit stacks for that candidate partition when the other possible bit stacks include any of the cells in that group. The partition selected is the one with the minimum total wirelength cost for the partition (equal to the sum of the wirelength costs of all candidate bit stacks in the partition). Unlike prior art bit extraction methods, the present invention is applicable to a cell cluster having N input cells, M output cells, and K bit stacks where K, N and M are all different. The method can be made timing aware by including timing information in the circuit description, and weighting connections between cells using weights based on the timing information.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

While identification of bit stacks for optimized placement of standard cell components is crucial to automated design of hybrid circuits that include both random logic and datapath logic, previous bit stack extraction algorithms have been ineffective for modern large-scale circuits, for many reasons. When bit slices are identified by maintaining the datapath structure from the VHDL, the hard constraints typically induce degradation in wirelength. Template based extraction is particularly inflexible, and often cannot discern all of the viable bit stack candidates in a design. Name based extraction requires cell labeling which is usually lost during the physical synthesis process, so bit stacks cannot be built at all. Network-flow based searching is not placement aware, i.e., just because gates are similar does not mean that wirelength improves, and cells are often incorrectly identified as a bit stack. Additionally, this approach must address many candidates by modifying the costs on the edges many times to build other optimal solutions, which is very time consuming. More generally, all of the prior art bit-stack extraction techniques cannot properly handle variations in the numbers of inputs, output or bit stacks, that is, they may work well for a cluster of cells having N inputs, N outputs, and N bit stacks, but they cannot find K bit stacks in a cluster having N inputs and M outputs, where K, N and M are all different.

In light of the foregoing, it would be desirable to devise an improved method of bit-slice extraction which is wirelength aware. It would be further advantageous if the method could be extended to be timing aware. The present invention achieves these objectives by defining bit stacks for a cluster of cells such that the wirelength cost of the bit stack partition is minimized. The process can be made timing aware by including wirelength weighting based on a scaled timing cost.

Figure 1A:
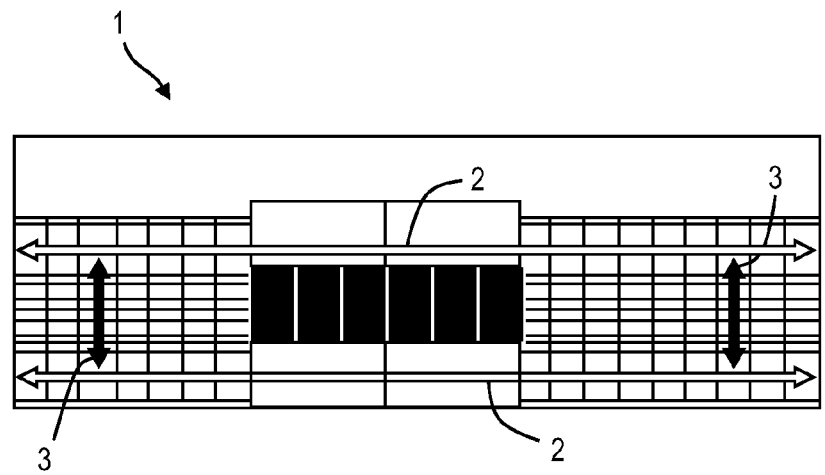
FIG. 1A is a plan view of an integrated circuit design having datapath logic with multiple bit stacks which have been aligned using conventional manual placement.
Figure 1B:
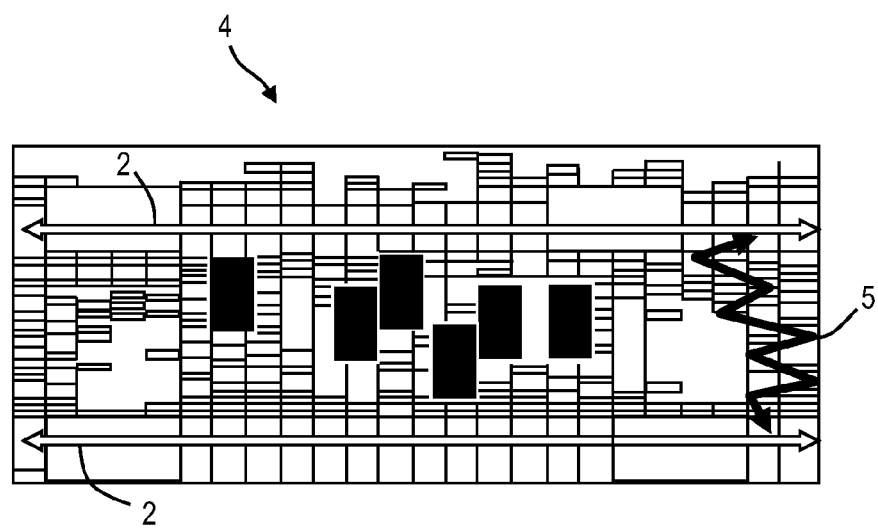
FIG. 1B is a plan view of the integrated circuit design of FIG. 1A laid out using conventional automatic placement, resulting in poor bit-stack alignment.
Figure 2:
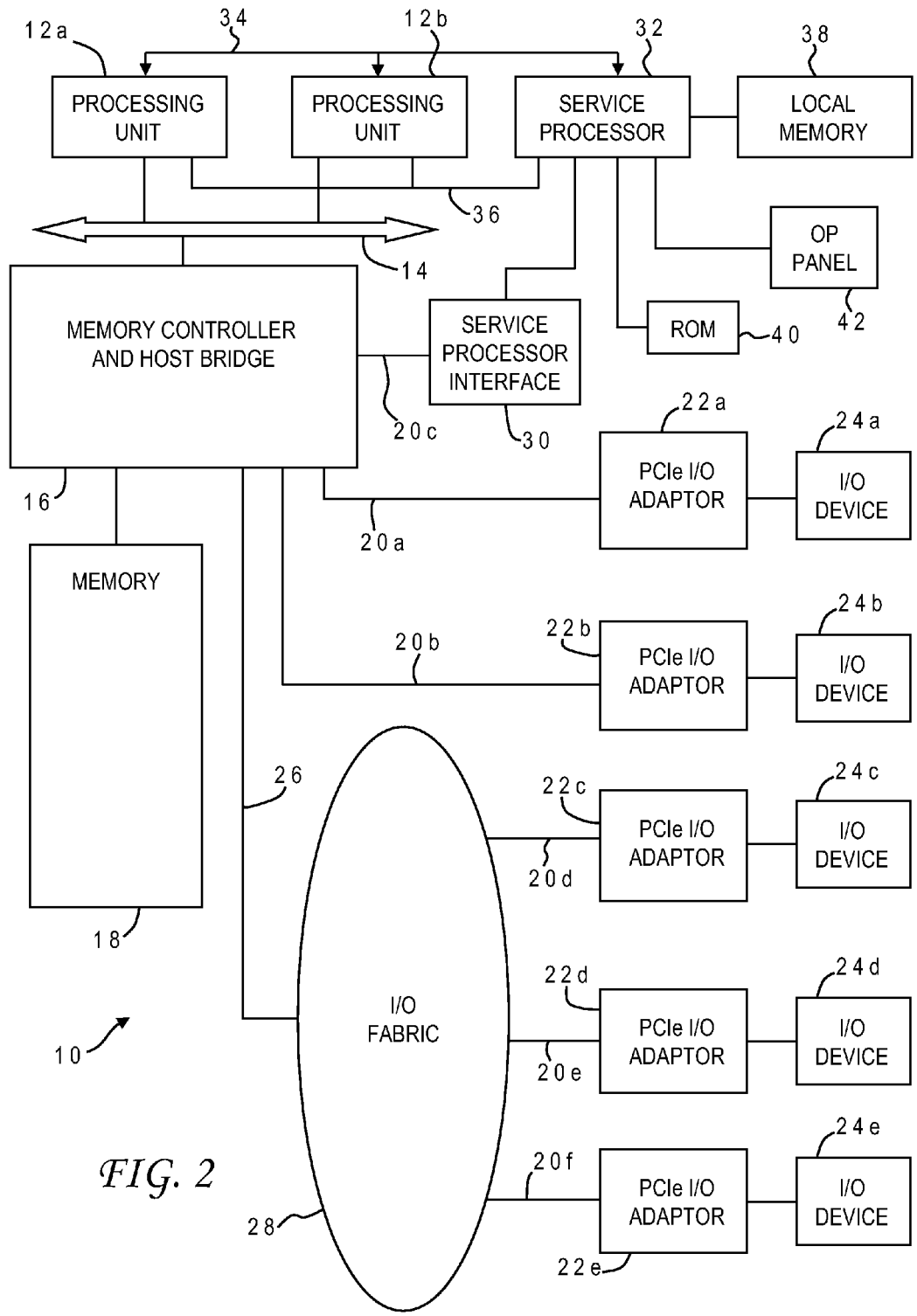
FIG. 2 is a block diagram of a computer system programmed to carry out the design of integrated circuits in accordance with one implementation of the present invention.

With reference now to the figures, and in particular with reference to FIG. 2, there is depicted one embodiment 10 of a computer system in which the present invention may be implemented to carry out the design of logic structures in an integrated circuit. Computer system 10 is a symmetric multiprocessor (SMP) system having a plurality of processors 12*a*, 12*b* connected to a system bus 14. System bus 14 is further connected to a combined memory controller/host bridge (MC/HB) 16 which provides an interface to system memory 18. System memory 18 may be a local memory device or alternatively may include a plurality of distributed memory devices, preferably dynamic random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20*a*, 20*b*, 20*c*. Each PCI Express (PCIe) link 20*a*, 20*b* is connected to a respective PCIe adaptor 22*a*, 22*b*, and each PCIe adaptor 22*a*, 22*b* is connected to a respective input/output (I/O) device 24*a*, 24*b*. MC/HB 16 may additionally have an interface to an I/O bus 26 which is connected to a switch (I/O fabric) 28. Switch 28 provides a fan-out for the I/O bus to a plurality of PCI links 20*d*, 20*e*, 20*f*. These PCI links are connected to more PCIe adaptors 22*c*, 22*d*, 22*e* which in turn support more I/O devices 24*c*, 24*d*, 24*e*. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12*a*, 12*b* may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20*c* connects MC/HB 16 to a service processor interface 30 to allow communications between I/O device 24*a* and a service processor 32. Service processor 32 is connected to processors 12*a*, 12*b* via a JTAG interface 34, and uses an attention line 36 which interrupts the operation of processors 12*a*, 12*b*. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention. The invention may further be implemented in an equivalent cloud computing network.

When computer system 10 is initially powered up, service processor 32 uses JTAG interface 34 to interrogate the system (host) processors 12*a*, 12*b* and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12*a*, 12*b* for execution of the program code, e.g., an operating system (OS) which is used to launch applications and in particular the circuit design application of the present invention, results of which may be stored in a hard disk drive of the system (an I/O device 24). While host processors 12*a*, 12*b* are executing program code, service processor 32 may enter a mode of monitoring and reporting any operating parameters or errors, such as the cooling fan speed and operation, thermal sensors, power supply regulators, and recoverable and non-recoverable errors reported by any of processors 12*a*, 12*b*, memory 18, and MC/HB 16. Service processor 32 may take further action based on the type of errors or defined thresholds.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable media may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. The computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this invention, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, written for a variety of platforms such as an AIX environment or operating systems such as Windows 7 or Linux. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks. Such storage media excludes transitory media.

The computer program instructions may further be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Computer system 10 carries out program instructions for a physical synthesis process that uses novel bit stack extraction techniques to assist in the optimization of cell placement. Accordingly, a program embodying the invention may include conventional aspects of various synthesis or placement tools, and these details will become apparent to those skilled in the art upon reference to this disclosure. In the illustrative implementation, computer system 10 carries out bit stack extraction by first obtaining a placement of the cells, such as through a limited number of iterations of global placement, and then identifies one or more clusters of the cells for this placement in which to search for candidate bit stacks. Candidate bit stacks for a given cluster are generated, and wirelength costs are calculated for the candidate bit stacks. The set of candidate bit stacks having the lowest total cost is selected for the final bit stacks using dynamic programming. The identified bit stacks can then be passed to a datapath placer for optimized placement.

In the exemplary embodiment, the cells undergo a limited number of global placement iterations, much less than for a typical global placement, but sufficient to provide an initial estimate for the locations of the cells. There may be, for example, 10 iterations of the global placement. A higher number of global placement iterations will improve the accuracy of the solution as well as the overall wirelength of the placement objective, but the added expense of the iterations may not be worth the marginal improvements. Other placement mechanisms may be used, and the present invention can even be applied to a random or non-optimized initial placement. The starting placement may be generated using computer system 10 or may be a placement from an earlier optimization performed on a different computer system, provided in the form of a netlist or other circuit description to computer system 10.

The clustering stage prepares the netlist to analyze and extract bit stacks. There are numerous conventional techniques for grouping cells of an integrated circuit design into clusters. The preferred implementation of the present invention uses an extension of the connectivity-based seed growth method proposed by Liu and Marek-Sadowska in the paper "Pre-Layout Physical Connectivity Predictions With Applications In Clustering, Placement And Logic Synthesis," Proc. ICCAD, pages 31-37 (2005). According to that technique, a ratio of external to internal cluster forces is maximized while maintaining a maximum logic depth threshold. The external force is defined as the summation of the edge weights of nets with at least one vertex (node) outside and one inside a given cluster $C_i$ and the internal force is defined as the summation of all internal cluster connection weights. Specific weight values can be determined according to the particular net model used. The internal and external forces affect the physical size of a cluster in opposite directions. The internal force tries to keep the nodes together in the final layout, whereas the external force tends to pull the nodes apart. This clustering method uses a bottom-up algorithm which starts from a seed node. Suitable seed nodes are those with large net degrees, i.e., the nodes are sorted by node degree, and a seed node is selected which is currently unclustered and has the largest node degree. Other methods may be used to find suitable seed nodes. The connectivity between a neighboring node u of a cluster $C_i$ is equal to the sum of edge weights for all connections between u and nodes within the cluster. In each subsequent pass, the neighboring node with the largest connectivity is added to the cluster while keeping the internal force of the cluster as large as possible. Neighboring nodes are added in each pass until the size of the cluster exceeds a cluster size constraint.

Other clustering techniques may be employed. Bit stack extraction may optionally be applied only to those clusters which have specifically been identified as datapath structures. Such identification may be made using a variety of techniques, including manual or automated, particularly the machine-learning based datapath identification technique disclosed in U.S. patent application Ser. No. 13/484,111 filed May 30, 2012, which is hereby incorporated. That technique uses cluster features such as automorphism generators and physical placement information to classify clusters as either datapath or random, with machine learning algorithms such as a support vector machine and a neural network. Clustering can be performed by computer system 10 or can also be previously performed on a different computer system, with the cluster information provided in the netlist received by computer system 10.

Figure 3:
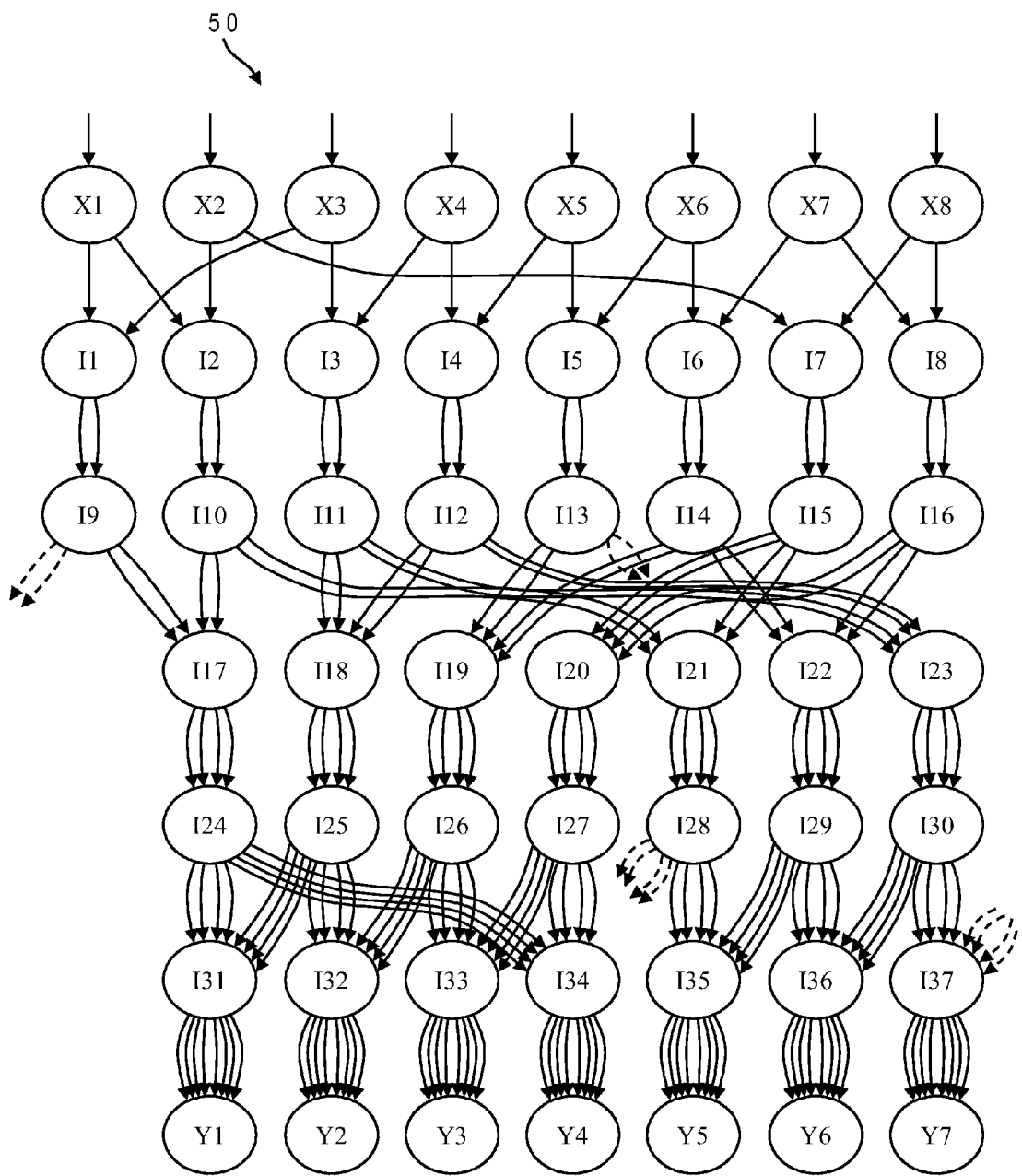
FIG. 3 is a graph of a cell cluster whose placement can be optimized by identifying bit stacks in accordance with one implementation of the present invention.

Once clusters in the netlist have been identified, computer system 10 proceeds to generate candidate bit stacks from groups of interconnected cells in each cluster. Different sets (partitions) of the candidate bit stacks in a given cluster represent possible solutions to the bit-slice extraction problem. That problem can be defined as follows: given a set of cells to place, an input vector $X=\{x_i, \ldots, x_n\}$ and an output vector $Y=\{y_i, \ldots, y_m\}$, define k bit-stacks such that the wirelength cost of the bit-stack partition is minimized. Different approaches may be employed to generate the candidate bit stacks; the preferred implementation uses cone tracing from the output vector Y to develop a set of candidates and corresponding costs based on wirelength. Candidate bit stack generation may be understood with reference to FIG. 3 which shows an example of a generalized circuit layout 50. Layout 50 may represent a cluster of cells that are part of a larger netlist, and the cells have been laid out as shown in FIG. 3 from a previous placement routine (e.g., global placement). In this example the cells include eight input cells X1-X8 (top row), thirty-seven internal cells I1-I37 (middle five rows), and seven output cells Y1-Y7 (bottom row). In addition to the internal connections between cells within this cluster, the cells may have external connections to cells outside of the cluster as indicated by the dashed lines connected to cells I9, I28, and I37.

Figure 4A:
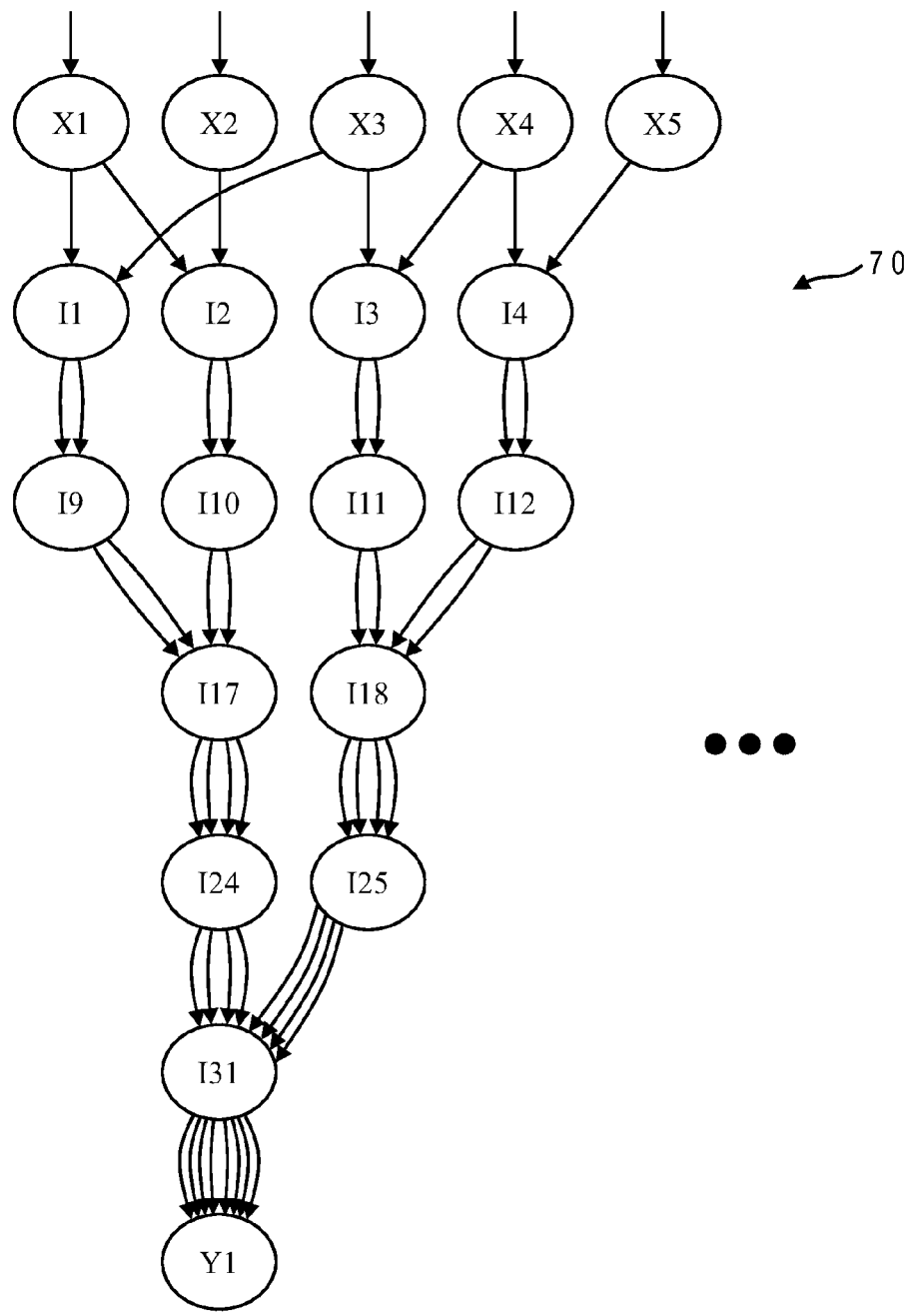
FIGS. 4A and 4B are graphs depicting how output cones of the cluster of FIG. 3 are traced to generate candidate bit stacks in accordance with one implementation of the present invention.
Figure 4B:
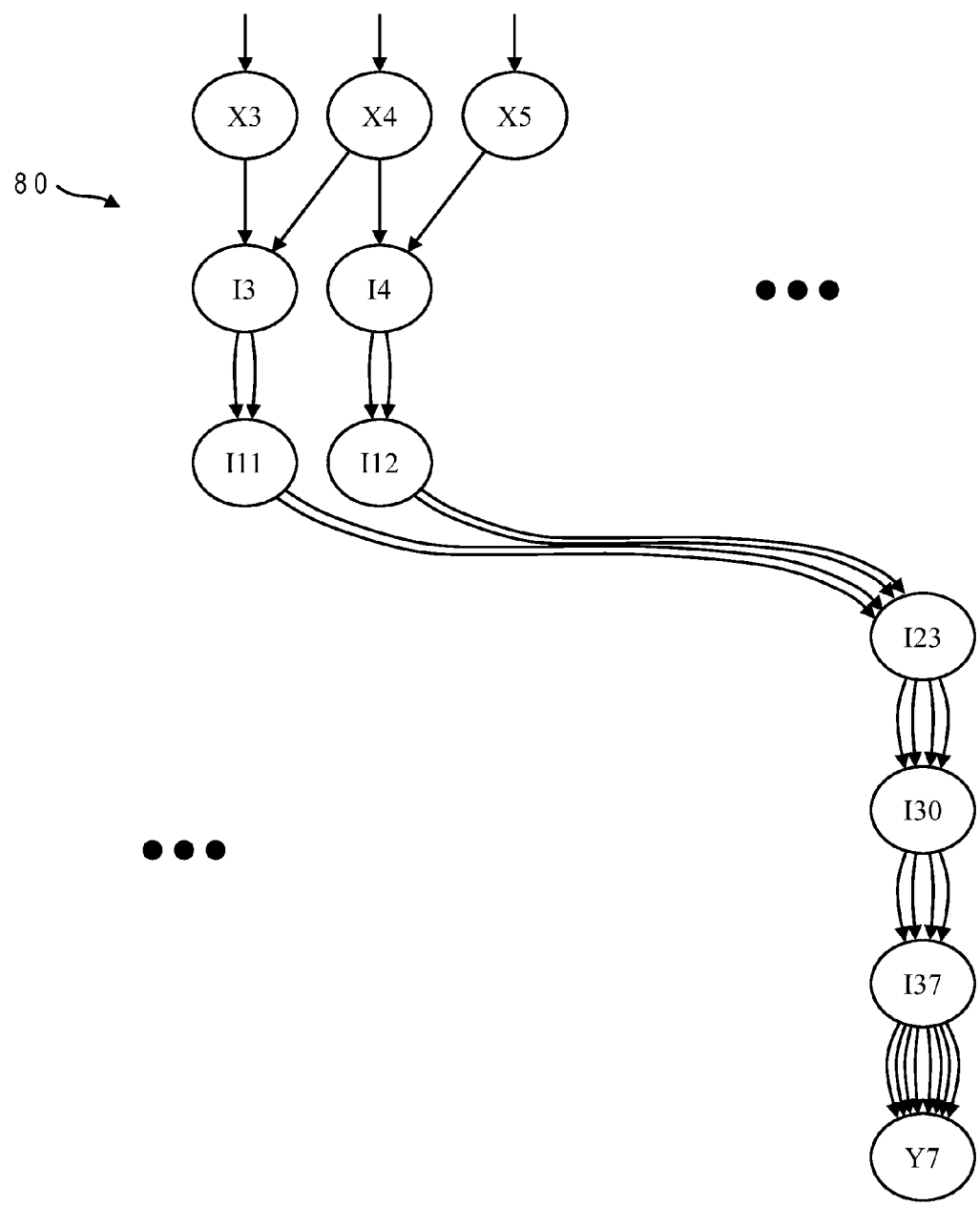
Figure 5:
FIG. 5 is a set of tables showing candidate bit stacks for the cluster of FIG. 3 and associated placement (wirelength) costs in accordance with one implementation of the present invention.

In this implementation, the output cones are traced (from a given output cell to its associated input cells) to build candidate bit stacks as depicted in FIGS. 4A and 4B. FIG. 4A illustrates an output cone 70 for output cell Y1 which includes internal cells I1, I2, I3, I4, I9, I10, I11, I12, I17, I18, I24, I25 and I31, and terminates with input cells X1, X2, X3, X4 and X5. For output cone 70, there are eight different possible bit stacks, two terminating at input cell X1, one terminating at input cell X2, two terminating at input cell X3, two terminating at input cell X4, and one terminating at input cell X5. The full paths of four of the bit stacks are shown in the candidate table 60 of FIG. 5. These paths are the four left-most bit stacks of output cone 70 as viewed in FIG. 4A. Each row of candidate table 60 represents one candidate bit stack.

Wirelength costs for each of the candidate bit stacks may be calculated as or after they are identified. The wirelength cost for a given candidate bit stack is the sum of the distances from each prior cell to the next along the bit stack based on cell locations using the initial placement estimates. In the illustrative implementation the wirelength is measured as a Manhattan distance, i.e., wirelength cost is $|x_2-x_1|+|y_2-y_1|$ where (x, y) are the coordinates of a given cell pin (x is the horizontal direction and y is the vertical direction in FIG. 3). For the example of FIG. 3, adjacent cells are separated by a unit distance, and for simplification the pin locations are deemed to be at the centers of the cells, leading to the specific wirelength costs seen in the cost table 62 of FIG. 5. Each row in cost table 62 corresponds to a row in candidate table 60, e.g., the top row of cost table 62 corresponds to the left-most bit stack in FIG. 4A comprised of cells Y1-I31-I24-I17-I9-I1-X1. The last column in cost table 62 shows the costs for the bit stacks represented by each row. In this limited example, it can be seen that the fourth row of cost table 62 has the lowest bit stack cost (6), so the corresponding bit stack (from Y1 to X2) will be selected for the final bit-stack partition.

This procedure is repeated for each logic cone defined by the output cells of the cluster. FIG. 4B illustrates the last logic cone 80 for output cell Y7. For output cone 80, there are four different possible bit stacks, one terminating at input cell X3, two terminating at input cell X4, and one terminating at input cell X5. Once all candidate bit stacks have been generated and the associated wirelength costs have been calculated, computer system 10 carries out dynamic programming to select the best set of candidates (bit-stack partition) as the final bit stacks. The programming is dynamic in the sense that any group of cells which have been identified as one possible bit stack for a candidate partition must then become the basis for excluding other possible bit stacks for that candidate partition when those other bit stacks include any of the cells in that group. This approach eliminates candidates dynamically which reduces the number of additional candidates to evaluate. For example, the tentative selection of the bit stack which originates with output cell Y1 and terminates at input cell X3 would exclude the possibility of the bit stack which originates with output cell Y7 and terminates at input cell X3 in the same candidate partition, since both of those bit stacks would include input cell X3.

Figure 6:
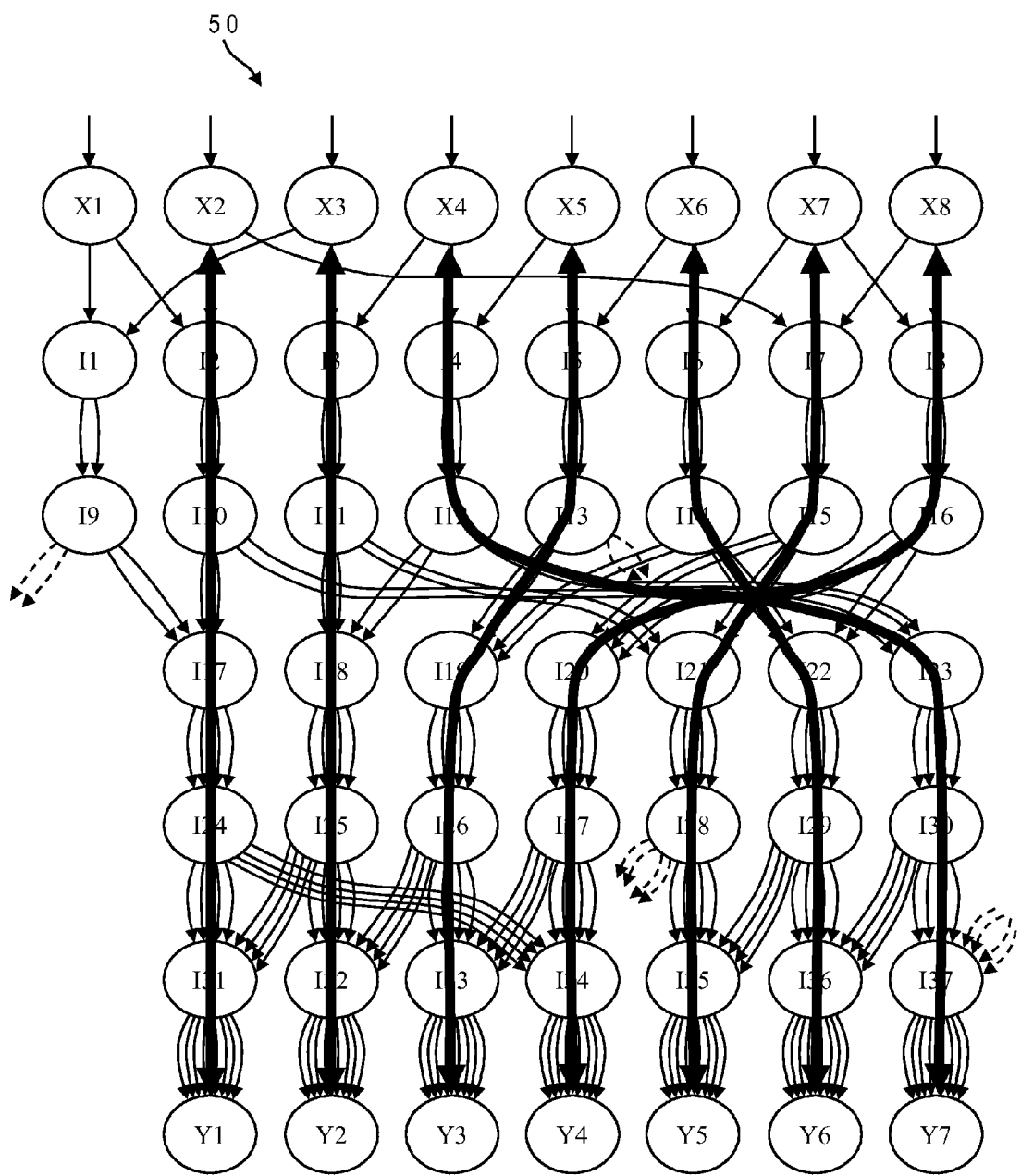
FIG. 6 is a graph depicting the final bit-stacks automatically selected for the cell cluster of FIG. 3 in accordance with one implementation of the present invention.

The final bit-stack partition selected by computer system 10 is that solution (set of exclusive bit stacks) which has the least total cost, i.e., the sum of the wirelength costs for all of the bit stacks in the candidate partition. For the simplified example of FIG. 3, these computations result in a final solution as depicted in FIG. 6 by the overlaid double-headed arrows. This optimized bit stack partition has seven bit stacks defined by output/input cell pairs as follows: Y1-X2; Y2-X3; Y3-X5; Y4-X8; Y5-X7; Y6-X6; Y7-X4. Cells X1, I1 and I9 are unused, that is, they are not identified as being part of any bit stack. This bit-stack information can be added to the machine-readable netlist (e.g., a modified VHDL file), and the netlist can be passed to an appropriate placer which uses targeted optimization for datapath logic.

In this instance the number of bit stacks found (seven) is different from the number of inputs but is the same as the number of outputs. However, those skilled in the art will appreciate that the available interconnections for a given cluster may result in an optimized partition having a number of bit stacks which is different from both the number of inputs and the number of outputs. For the simplest case where the number of inputs equals the number of outputs and there is only one path from a given output back to its associated input, the method of the present invention will always result in the proper identification of the corresponding bit stacks which will force the neat alignment of all of the cells regardless of the cell locations from a previous placement.

The present invention can advantageously be extended for timing awareness by weighting the edges with timing information, thereby improving both placement and timing. The timing weights for a particular edge may be assigned manually or automatically according to conventional techniques. In the preferred implementation computer system 10 calculates the timing-aware cost of a bit stack using a scaled timing cost Z in the range of 0 to 1, i.e., the cost for a pair of interconnected cells is $|x_2-x_1|+[|y_2-y_1|\times(1+Z)]$.

Figure 7:
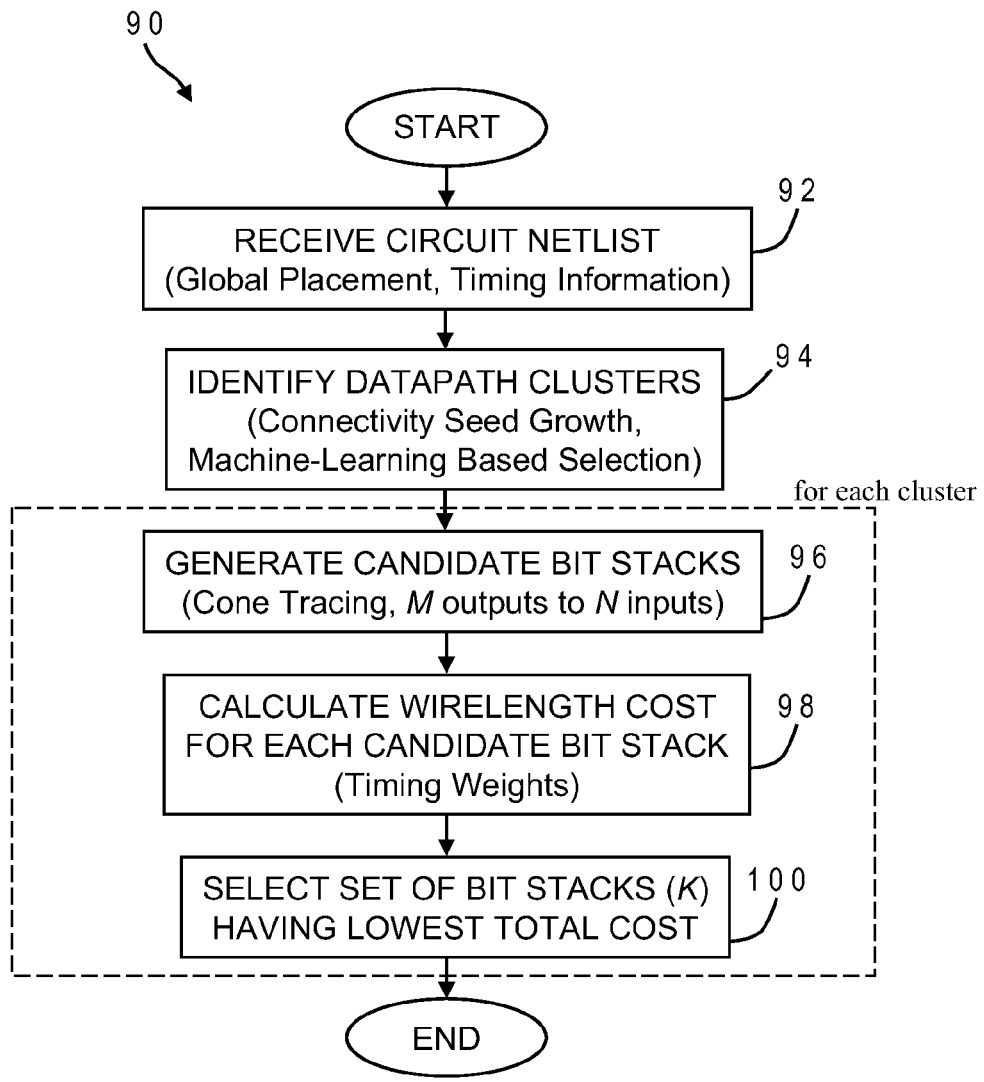
FIG. 7 is a chart illustrating the logical flow for a bit-stack extraction process in accordance with one implementation of the present invention.

The invention may be further understood with reference to the chart of FIG. 7 which illustrates a bit-stack extraction process 90 in accordance with one implementation of the present invention. Process 90 begins when computer system 10 receives the netlist, including cell location information from a previous (global) placement and including timing information (92). Datapath clusters are identified in the design using the connectivity seed growth approach followed by machine-learning based datapath identification (94). Then for each cluster, candidate bit stacks are generated using cone tracing (96), and wirelength costs for each candidate bit stack are calculated, with the inclusion of timing weights (98). A set of the bit stacks is selected for the cluster which has the lowest total wirelength cost (100).

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of identifying bit stacks in an integrated circuit design comprising:
    receiving a circuit description for the integrated circuit design which includes a plurality of cells interconnected to form a plurality of nets, the cells having locations from a previous placement, by executing first instructions in a computer system;
    identifying at least one cluster of the cells from the design, by executing second instructions in the computer system;
    generating candidate bit stacks from groups of interconnected cells in the cluster, by executing third instructions in the computer system;
    calculating wirelength costs for the candidate bit stacks based on the cell locations, by executing fourth instructions in the computer system; and
    selecting a partition from a plurality of different partitions of the candidate bit stacks as final bit stacks wherein said selecting is based on a minimum total wirelength cost for the partition equal to the sum of the wirelength costs of all candidate bit stacks in the partition, by executing fifth instructions in the computer system.

2. The method of claim 1, wherein said generating includes cone tracing from output cells of the cluster to input cells of the cluster.

3. The method of claim 1, wherein the previous placement is derived from multiple iterations of a global placement routine.

4. The method of claim 1, wherein the circuit description further includes timing information, and said calculating includes weighting connections between cells using weights based on the timing information.

5. The method of claim 1, wherein said selecting includes dynamic programming whereby a group of cells which have been identified as a possible bit stack for a candidate partition are used to exclude other possible bit stacks for that candidate partition when the other possible bit stacks include any of the cells in that group.

6. The method of claim 1, wherein the cluster is identified as a datapath structure.

7. The method of claim 1, wherein the cluster has a number N of input cells and a number M of output cells where M≠N, and the partition has a number K of bit stacks where K≠N, K≠M, and K, M, and N are integers greater than zero.

8. A computer system for identifying bit stacks in an integrated circuit design comprising:
    one or more processors which process program instructions;
    a memory device connected to said one or more processors; and
    program instructions residing in said memory device for receiving a circuit description for the integrated circuit design which includes a plurality of cells interconnected to form a plurality of nets wherein the cells having locations from a previous placement, identifying at least one cluster of the cells from the design, generating candidate bit stacks from groups of interconnected cells in the cluster, calculating wirelength costs for the candidate bit stacks based on the cell locations, and selecting a partition from a plurality of different partitions of the candidate bit stacks as final bit stacks wherein the selecting is based on a minimum total wirelength cost for the partition equal to the sum of the wirelength costs of all candidate bit stacks in the partition.

9. The computer system of claim 8, wherein the generating includes cone tracing from output cells of the cluster to input cells of the cluster.

10. The computer system of claim 8, wherein the previous placement is derived from multiple iterations of a global placement routine.

11. The computer system of claim 8, wherein the circuit description further includes timing information, and the calculating includes weighting connections between cells using weights based on the timing information.

12. The computer system of claim 8, wherein the selecting includes dynamic programming whereby a group of cells which have been identified as a possible bit stack for a candidate partition are used to exclude other possible bit stacks for that candidate partition when the other possible bit stacks include any of the cells in that group.

13. The computer system of claim 8, wherein the cluster is identified as a datapath structure.

14. The computer system of claim 8, wherein the cluster has a number N of input cells and a number M of output cells where M≠N, and the partition has a number K of bit stacks where K≠N, K≠M, and K, M, and N are integers greater than zero.

15. A computer program product for identifying bit stacks in an integrated circuit design comprising:
    a computer-readable storage medium; and
    program instructions residing in said storage medium for receiving a circuit description for the integrated circuit design which includes a plurality of cells interconnected to form a plurality of nets wherein the cells having locations from a previous placement, identifying at least one cluster of the cells from the design, generating candidate bit stacks from groups of interconnected cells in the cluster, calculating wirelength costs for the candidate bit stacks based on the cell locations, and selecting a partition from a plurality of different partitions of the candidate bit stacks as final bit stacks wherein the selecting is based on a minimum total wirelength cost for the partition equal to the sum of the wirelength costs of all candidate bit stacks in the partition.

16. The computer program product of claim 15, wherein the generating includes cone tracing from output cells of the cluster to input cells of the cluster.

17. The computer program product of claim 15, wherein the previous placement is derived from multiple iterations of a global placement routine.

18. The computer program product of claim 15, wherein the circuit description further includes timing information, and the calculating includes weighting connections between cells using weights based on the timing information.

19. The computer program product of claim 15, wherein the selecting includes dynamic programming whereby a group of cells which have been identified as a possible bit stack for a candidate partition are used to exclude other possible bit stacks for that candidate partition when the other possible bit stacks include any of the cells in that group.

20. The computer program product of claim 15, wherein the cluster is identified as a datapath structure.

21. The computer program product of claim 15, wherein the cluster has a number N of input cells and a number M of output cells where $M \neq N$, and the partition has a number K of bit stacks where $K \neq N$, $K \neq M$, and K, M, and N are integers greater than zero.

* * * * *